(12) United States Patent
Chodem et al.

(10) Patent No.: US 9,582,205 B2
(45) Date of Patent: Feb. 28, 2017

(54) PROTECTION SCHEME WITH DUAL PROGRAMMING OF A MEMORY SYSTEM

(71) Applicant: SanDisk Technologies Inc., Plano, TX (US)

(72) Inventors: Nagi Reddy Chodem, Bangalore (IN); Abhijeet Manohar, Bangalore (IN); Vijay Sivasankaran, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 160 days.

(21) Appl. No.: 14/291,560

(22) Filed: May 30, 2014

(65) Prior Publication Data

US 2015/0301755 A1    Oct. 22, 2015

(30) Foreign Application Priority Data

Apr. 17, 2014 (IN) .......................... 1992/CHE/2014

(51) Int. Cl.
| | |
|---|---|
| *G06F 3/06* | (2006.01) |
| *G06F 11/16* | (2006.01) |
| *G06F 12/02* | (2006.01) |
| *G06F 11/10* | (2006.01) |
| *G11C 29/52* | (2006.01) |
| *G11C 16/10* | (2006.01) |

(52) U.S. Cl.
CPC ............ *G06F 3/0619* (2013.01); *G06F 3/064* (2013.01); *G06F 3/065* (2013.01); *G06F 3/0632* (2013.01); *G06F 3/0658* (2013.01); *G06F 3/0679* (2013.01); *G06F 3/0688* (2013.01); *G06F 11/1068* (2013.01); *G06F 11/1612* (2013.01); *G06F 11/1666* (2013.01); *G06F 12/0246* (2013.01); *G11C 16/105* (2013.01); *G11C 29/52* (2013.01); *G06F 2212/72* (2013.01)

(58) Field of Classification Search
CPC .. G06F 3/0619; G06F 11/1068; G06F 3/0679; G06F 3/0658; G06F 3/064; G06F 3/0632; G06F 3/065; G06F 11/1612; G06F 3/0688; G06F 2212/72; G06F 11/1666; G06F 12/0246; G11C 29/52; G11C 16/105
USPC ........ 714/764, 718, 763, 769, 773; 365/200, 365/201
See application file for complete search history.

(56) References Cited

U.S. PATENT DOCUMENTS

| | | | |
|---|---|---|---|
| 8,187,936 B2 | 5/2012 | Alsmeier et al. | |
| 8,244,960 B2* | 8/2012 | Paley | G06F 12/0246 711/103 |
| 8,489,942 B1* | 7/2013 | Wong | G06F 12/0246 365/185.33 |

(Continued)

OTHER PUBLICATIONS

U.S. Appl. No. 14/133,979, filed Dec. 19, 2013, 121 pages.

(Continued)

*Primary Examiner* — John J Tabone, Jr.
(74) *Attorney, Agent, or Firm* — Brinks Gilson & Lione

(57) ABSTRACT

A memory system or flash memory device may include a linking or grouping of blocks that are used for dual writing. In particular, meta-blocks in the memory may be linked in such a way that enables a data transfer to simultaneously occur in two meta-blocks. The dual versions of the programming may be used for error correction. If there is a failure or write error in one of the meta-blocks, then the data from the other meta-block may be used. If there is no failure then the secondary meta-block may be erased.

20 Claims, 13 Drawing Sheets

(56) References Cited

U.S. PATENT DOCUMENTS

| | | | | |
|---|---|---|---|---|
| 8,504,798 | B2* | 8/2013 | Conley | G06F 12/0246 711/100 |
| 8,812,776 | B2* | 8/2014 | Chang | G06F 12/0246 711/103 |
| 9,268,688 | B2* | 2/2016 | Yeh | G06F 12/0246 |
| 2005/0144361 | A1* | 6/2005 | Gonzalez | G06F 12/0246 711/103 |
| 2005/0251617 | A1* | 11/2005 | Sinclair | G06F 3/061 711/103 |
| 2006/0285397 | A1* | 12/2006 | Nishihara | G06F 3/061 365/185.33 |
| 2007/0101096 | A1 | 5/2007 | Gorobets | |
| 2007/0143560 | A1* | 6/2007 | Gorobets | G06F 12/0246 711/170 |
| 2009/0070520 | A1* | 3/2009 | Mizushima | G06F 12/0246 711/103 |
| 2010/0042774 | A1* | 2/2010 | Yang | G06F 12/0246 711/103 |
| 2010/0172179 | A1* | 7/2010 | Gorobets | G06F 12/0246 365/185.09 |
| 2010/0174845 | A1* | 7/2010 | Gorobets | G06F 12/0246 711/103 |
| 2010/0174846 | A1* | 7/2010 | Paley | G06F 12/0246 711/103 |
| 2010/0174847 | A1* | 7/2010 | Paley | G06F 12/0246 711/103 |
| 2010/0223423 | A1* | 9/2010 | Sinclair | G06F 3/0608 711/103 |
| 2010/0287433 | A1* | 11/2010 | Mu | G06F 11/1666 714/746 |
| 2011/0096601 | A1* | 4/2011 | Gavens | G11C 11/5628 365/185.09 |
| 2012/0159043 | A1* | 6/2012 | Yeh | G06F 12/0246 711/103 |
| 2012/0191664 | A1* | 7/2012 | Wakrat | G06F 12/0246 707/684 |
| 2012/0191927 | A1* | 7/2012 | Gorobets | G06F 12/0246 711/156 |
| 2013/0019076 | A1* | 1/2013 | Amidi | G06F 11/1441 711/162 |
| 2013/0262747 | A1* | 10/2013 | Chang | G06F 12/0246 711/103 |
| 2015/0012684 | A1* | 1/2015 | Avila | G06F 3/0688 711/103 |
| 2015/0154109 | A1* | 6/2015 | Fiterman | G06F 12/0246 711/103 |

OTHER PUBLICATIONS

U.S. Appl. No. 14/136,103, filed Dec. 20, 2013, 56 pages.

Arya, P., "A Survey of 3D Nand Flash Memory", *EECS Int'l Graduate Program*, National Chiao Tung University, 2012, pp. 1-11.

Fisher, Ryan, "Optimizing NAND Flash Performance," Santa Clara, California, Aug. 2008, 23 pp.

Jang et al., "Vertical Cell Array using TCAT(Terabit Cell Array Transistor) Technology for Ultra High Density NAND Flash Memory," *2009 Symposium on Vlsi Technology Digest of Technical Papers*, pp. 192-193, 2009.

Mohan, Vidyabhushan, "Modeling the Physical Characteristics of NAND Flash Memory," Powerpoint Presentation, undated, 22 pp.

Micheloni, R. "NAND Overview: From Memory to Systems," from *Inside NAND Flash Memories*, DO1 10.1007/978-90-481-9431-5555_2, © Springer Science+Business Media B.V. 2010, pp. 19-53.

Micron Technical Note, "TN-29-25: Improving Performance Using Two-Plane Commands," Source: 09005aef82cfa647, Micron Technology, Inc., 2007, 11 pp.

Nowak, E. et al., "Intrinsic Fluctuations in Vertical Nand Flash Memories", *2012 Symposium on VLSI Technology Digest of Technical Papers*, 2012, pp. 21-22.

International Search Report and Written Opinion mailed Jul. 8, 2015 for PCT Application No. PCT/US2015/026155.

C. Gong et al., "On-Line Error Detection Through Data Duplication in Distributed-Memory Systems," *Microprocessors and Microsystems, IPC Business Press Ltd.*, London, GB, vol. 21, No. 3, Dec. 15, 1997, pp. 197-209 (13 pp.).

* cited by examiner

Exemplary Block Cycling

PROTECTION SCHEME WITH DUAL PROGRAMMING OF A MEMORY SYSTEM

PRIORITY

This application claims priority to Indian Patent Application No. 1992/CHE/2014, entitled "PROTECTION SCHEME WITH DUAL PROGRAMMING OF A MEMORY SYSTEM," filed on Apr. 17, 2014, the entire disclosure of which is hereby incorporated by reference.

TECHNICAL FIELD

This application relates generally to memory devices. More specifically, this application relates to the protection of data in flash memory by maintaining a duplicate copy of data in different blocks.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory may be written in pages and erased in blocks, so once a page is written, a rewrite may require the whole block to be erased. Rewrites may be necessary if there is a write error or failure. For example, NAND defects including broken word lines (WL) or word-line to wordline (WL-WL) shorts may result in data errors. Protection may be necessary to limit write failures and allow for data recovery in the case of a failure.

SUMMARY

A memory system or flash memory device may include a linking or grouping of blocks that are used for maintaining a duplicate copy of data in different blocks. A primary and secondary meta-block may be update blocks for host data that are located on different die. Because the meta-blocks are located on different die, the programming of both blocks may occur substantially simultaneously. In alternative embodiments, dual write programming may also be used for meta-blocks from the same die. The host data transfer from the blocks may be simultaneously or serially depending on the system architecture. The dual programming of the blocks with the duplicate copy may be used for error correction. If there is a failure or write error in the primary meta-block, then the duplicate data from the secondary meta-block may be used. If there is no failure in the programming of the primary meta-block, then the secondary meta-block may be erased.

BRIEF DESCRIPTION OF THE PRESENTLY PREFERRED EMBODIMENTS

Figure 1:
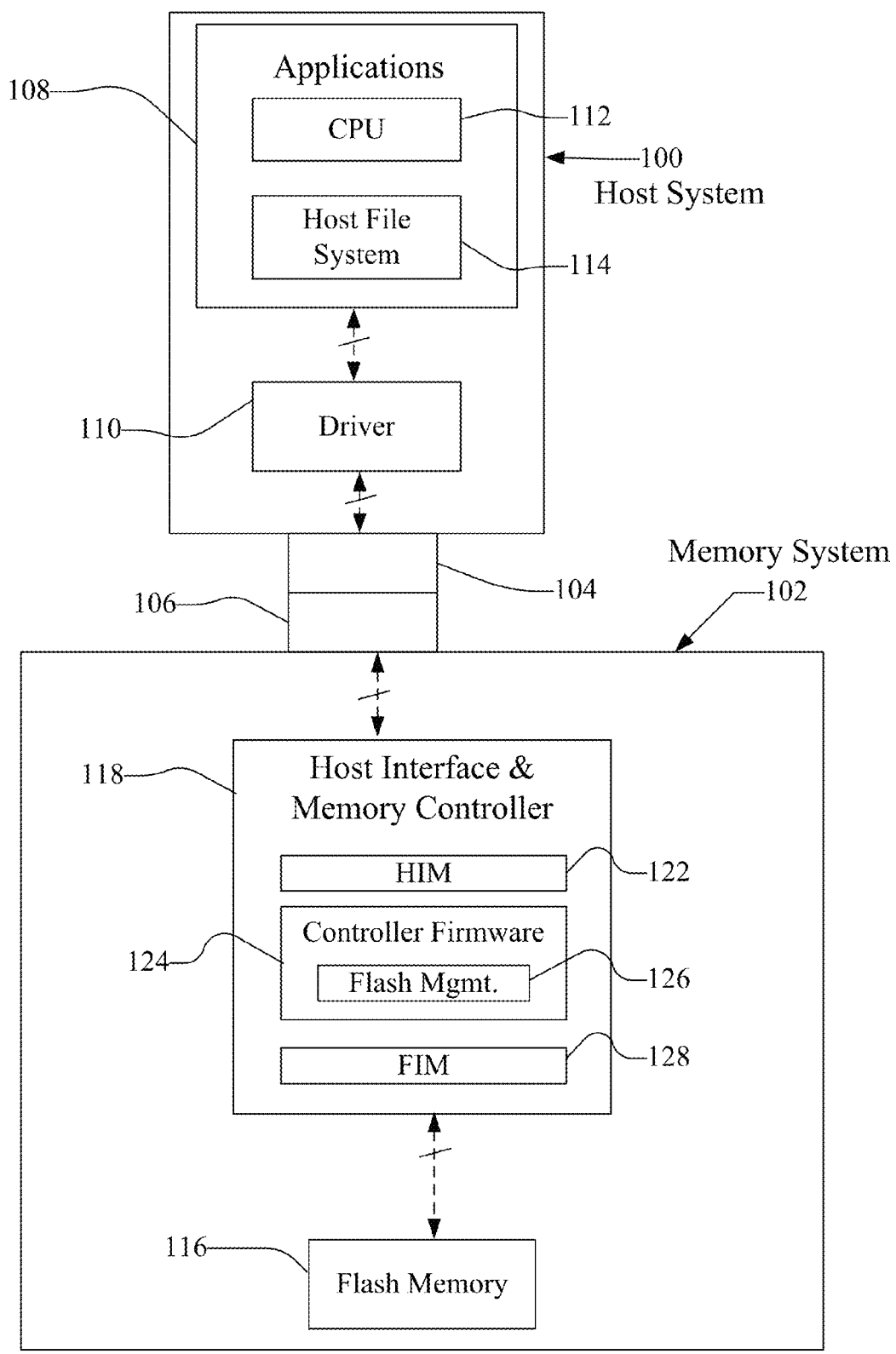
FIG. 1 is a block diagram of a host connected with a memory system having non-volatile memory.

A flash memory system suitable for use in implementing aspects of the invention is shown in FIGS. 1-4. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the Multi-MediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may be implemented on a single integrated circuit chip, such as an application specific integrated circuit (ASIC). The device controller 118 may include a multi-thread processor capable of communicating via a memory interface 128 having I/O ports for each memory bank in the flash memory 116. The device controller 118 may include an internal clock. The processor of the device controller 118 may communicate with an error correction code (ECC) module, a RAM buffer, and a boot code ROM via an internal data bus.

The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module (FIM) 128. Flash management logic 126 may be part of the controller firmware 124 for internal memory management operations such as garbage collection. One or more flash interface modules (FIMs) 128 may provide a communication interface between the controller and the flash memory 116. The memory device firmware may handle memory in logical groups and the logical to physical address table (i.e. the global address table or "GAT") may have an entry for each logical group. In particular, the GAT page may include mapping of the logical to the physical address translation for each logical group.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the flash memory 116. The FTL may include the logical block address ("LBA") map that translates addresses for the flash memory. An FTL algorithm may provide logical to physical address mapping which includes an algorithm to convert logical addresses from the file system to physical addresses of flash memory. The FTL may include the establishment or classification of meta-blocks and the dual programming of those meta-blocks as discussed below with respect to FIGS. 5-12.

In one embodiment, the flash memory 116 may be considered to include multi-level cell (MLC) or single level cell (SLC) memory. The memory may be included as part of the device controller 118 rather than as part of the flash memory 116 in some embodiments. The flash memory 116 may be mostly MLC, while binary cache and update blocks may be SLC memory. Update blocks may be SLC memory with page based addressing or page based Logical Group (LG) organization. The LG size for the GAT may depend on the data. For example, sequential data may be indexed with a large LG size, while fragmented data may be indexed with a smaller LG size. In particular, the GAT may default to a large LG size, but reference additional GAT pages for fragmented data, where the additional GAT pages include a smaller LG size. The LG size for the GAT and additional GAT pages may occur at the FTL or flash management 126 of the controller 118.

Figure 2:
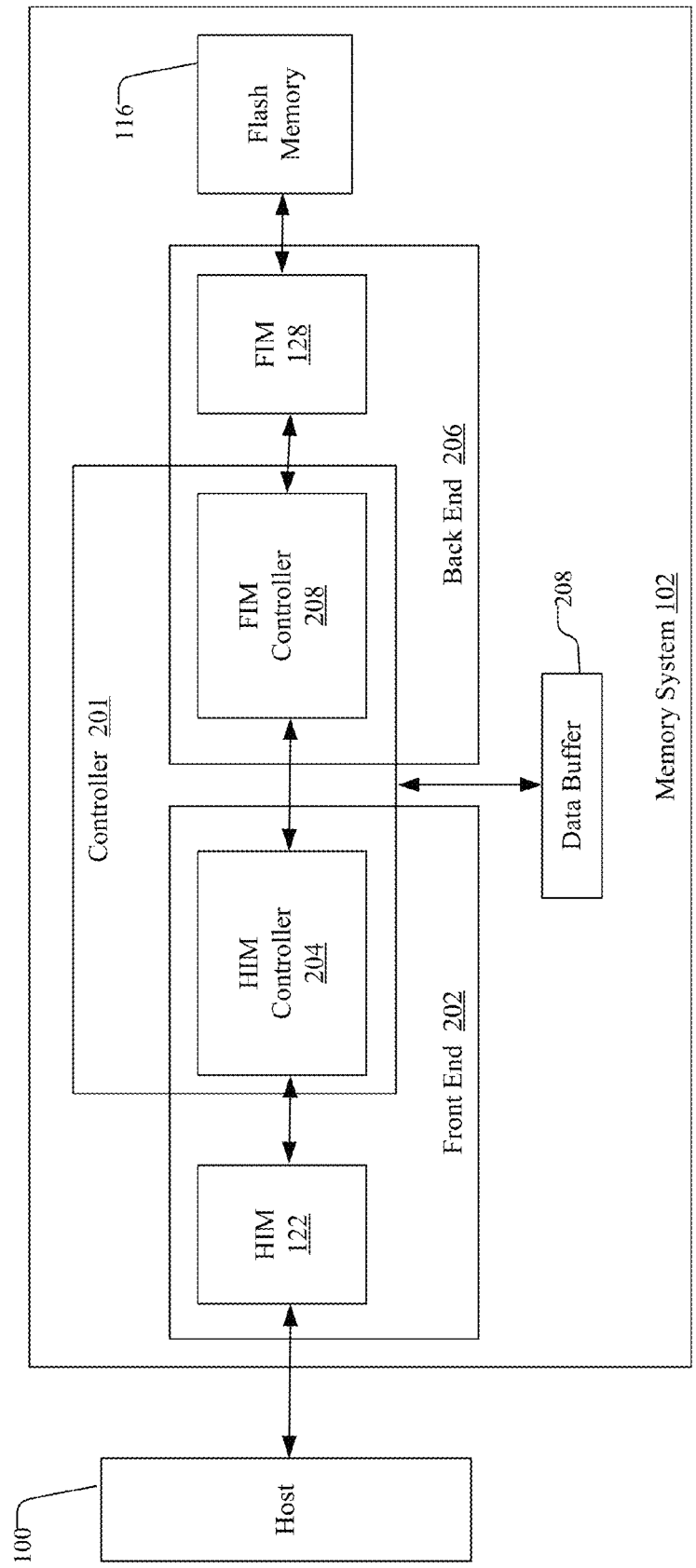
FIG. 2 is a block diagram of an alternative memory communication system.

FIG. 2 is a block diagram of an alternative memory communication system. The host system 100 is in communication with the memory system 102 as discussed with respect to FIG. 1. The memory system 102 includes a front end 202 in communication with the host and a back end 206 coupled with the flash memory 116. In one embodiment, the front end 202 and the back end 206 may be referred to as the memory controller and may be part of the device controller 118. The front end 202 may logically include a Host Interface Module (HIM) 122 and a HIM controller 204. The back end 206 may logically include a Flash Interface Module (FIM) 128 and a FIM controller 208. Accordingly, the controller 201 may be logically portioned into two modules, the HIM controller 204 and the FIM controller 208. The HIM 122 provides interface functionality for the host device 100, and the FIM 128 provides interface functionality for the flash memory 116. The controller 201 may be coupled with a data buffer 208.

In operation, data is received from the HIM 122 by the HIM controller 204 during a write operation of host device 100 on the memory system 102. The HIM controller 204 may pass control of data received to the FIM controller 208, which may include the FTL discussed above. The FIM controller 208 may determine how the received data is to be written onto the flash memory 116 optimally. The received data may be provided to the FIM 128 by the FIM controller 208 for writing data onto the flash memory 116 based on the determination made by the FIM controller 208. The FIM controller 208 and the FTL may operate the meta-block linking and dual programming to those meta-blocks as described below with respect to FIGS. 5-12.

Figure 3:
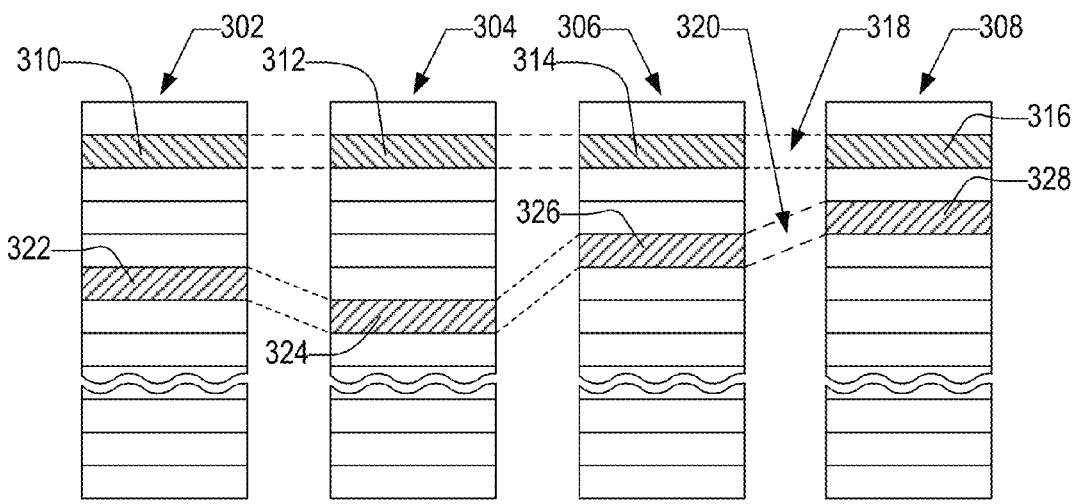
FIG. 3 is an example physical memory organization of the system of FIG. 1.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. Although not shown in FIG. 3, the meta-blocks described below with respect to FIG. 6 may be linked from across different dies. For example, there may be two planes per di and the meta-block linking shown in FIG. 6 links planes from different dies.

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units or chunks. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below with respect to FIG. 6, the meta-block may be created with planes from different dies. In other words, each meta-block includes planes from different dies.

Figure 4:
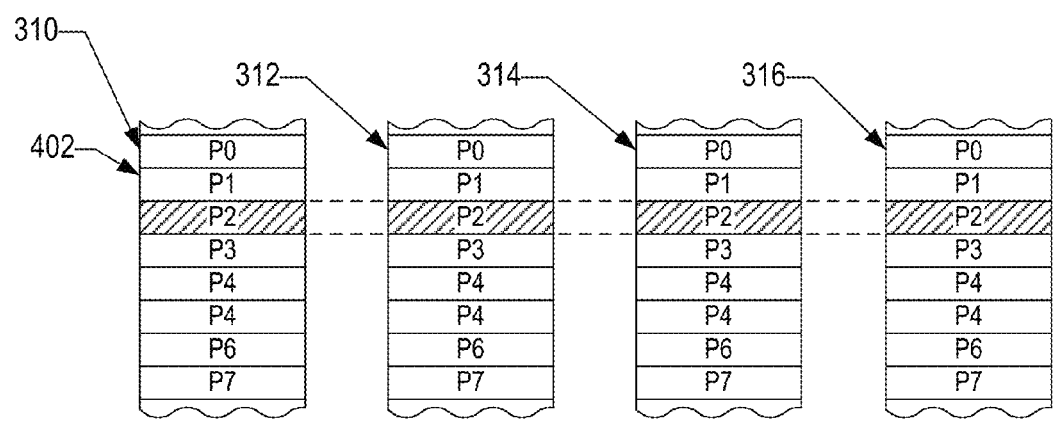
FIG. 4 is an expanded view of a portion of the physical memory of FIG. 3.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material.

Figure 5:
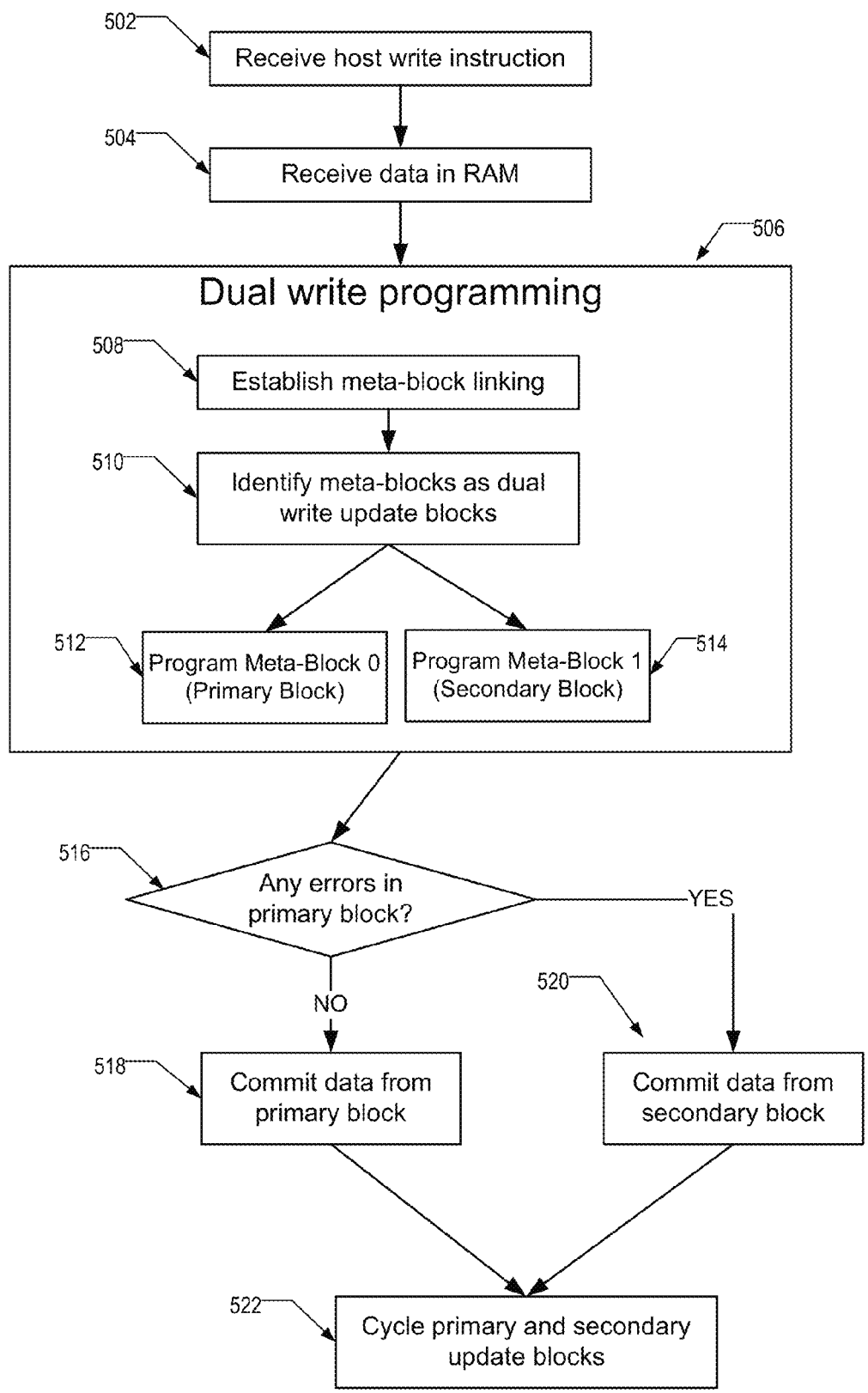
FIG. 5 is flow chart illustrating an exemplary dual programming process.

FIG. 5 is flow chart illustrating an exemplary dual programming process. FIG. 5 illustrates an exemplary process by which data protection may be achieved through the dual writing to multiple meta-blocks. In block 502, a host write instruction is received at the memory system (e.g. at the host interface). Based on the instruction from the host (to program certain data on the memory), the data is received in RAM in block 504. From the RAM, the memory system may utilize the dual programming in block 506. Dual programming may include simultaneous or near simultaneous programming of the same data in different blocks. In the embodiment described below, the data is written to two blocks, but in other embodiments, there may be additional blocks for programming the data for added protection.

The dual programming 506 may include an initial establishment of meta-block linking in block 508. The meta-block linking may not occur as part of every host write instruction, but rather may be set upon initialization and further updated (e.g. as in the cycling of blocks as discussed below in block 522). In other words, the establishing of meta-block linking may be optional for each host write if meta-block linking previously occurred.

Figure 6:
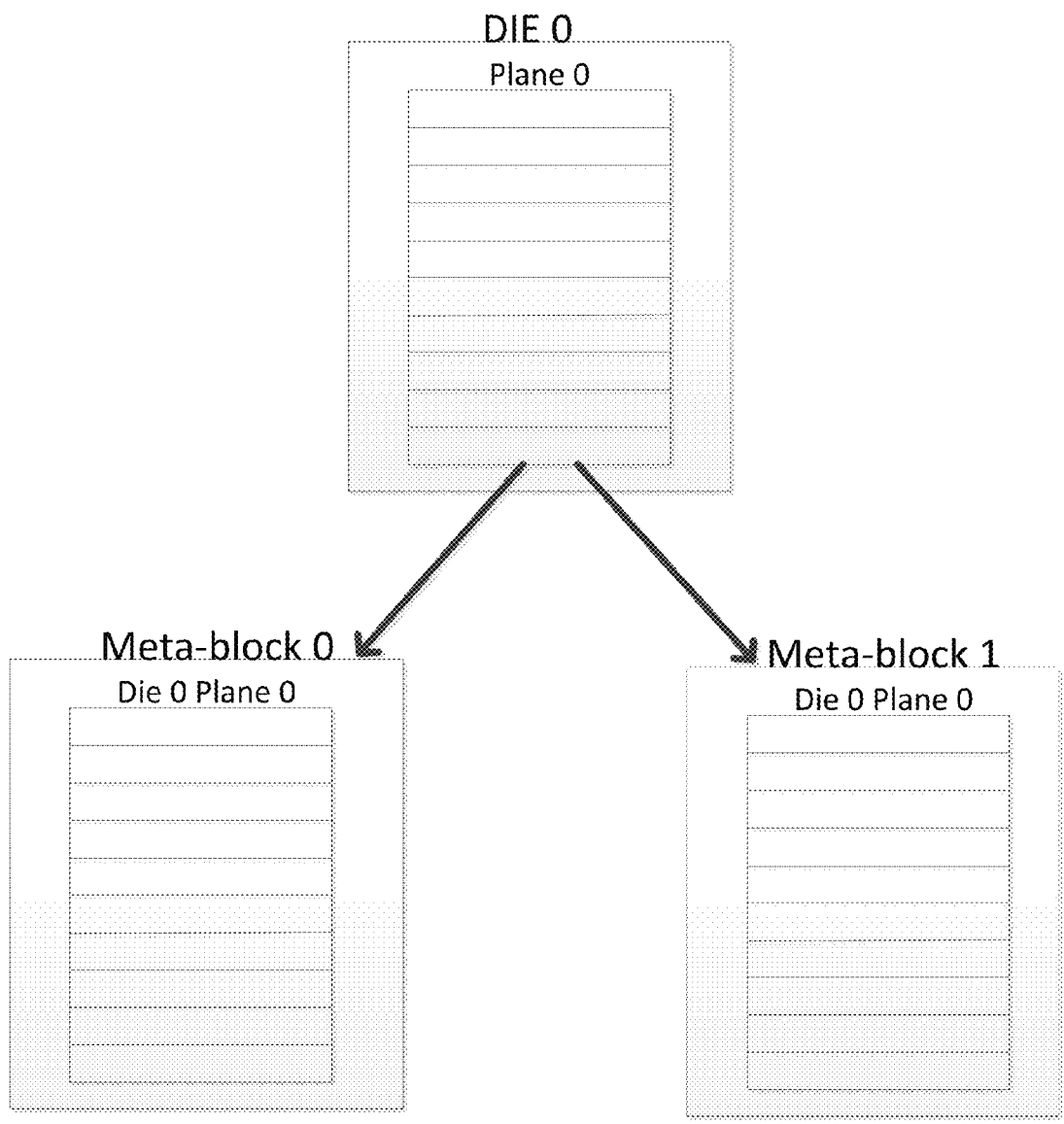
FIG. 6 is an example of meta-block linking in a single die system.
Figure 7:
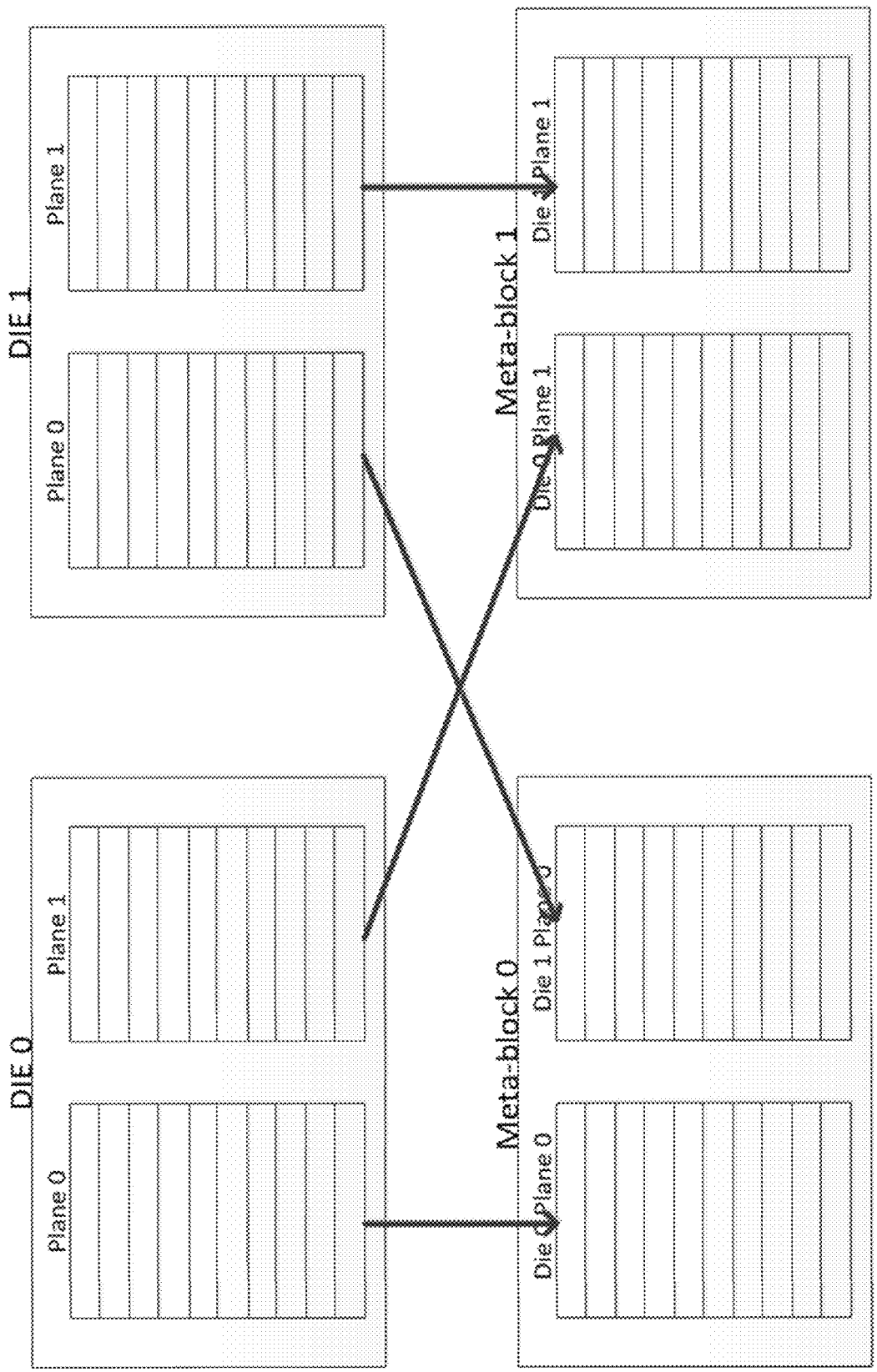
FIG. 7 is an example of meta-block linking in a multiple die system.

FIG. 6 is an example of meta-block linking in a single die system. FIG. 6 illustrates one die (Die 0) from which the two meta-blocks are formed (Meta-block 0 and Meta-block 1). In some embodiments, there may be dual or simultaneous programming from meta-blocks from the same die as shown in FIG. 6. FIG. 7 illustrates dual programming of meta-blocks that are linked from different die.

FIG. 7 is an example of meta-block linking in a multiple die system. FIG. 7 illustrates two dies (Die 0 and Die 1) with two planes for each die (Plane 0 and Plane 1). Meta-blocks may be established for the dual programming. As shown in FIG. 7, the meta-blocks may include planes from different dies. In particular, meta-block 0 includes Plane 0 from Die 0 and Plane 0 from Die 1. Meta-block 1 includes Plane 1 from Die 0 and Plane 1 from Die 1. Because each meta-block includes planes from different dies, simultaneous or near-simultaneous (e.g. dual) programming may be utilized to the two meta-blocks. In alternative embodiments, there may be more dies or planes and the programming may be more than two programming instances (e.g. triplicate programming). In another alternative embodiment, dual programming may be utilized for meta-blocks from the same die as shown in FIG. 6.

Figure 8:
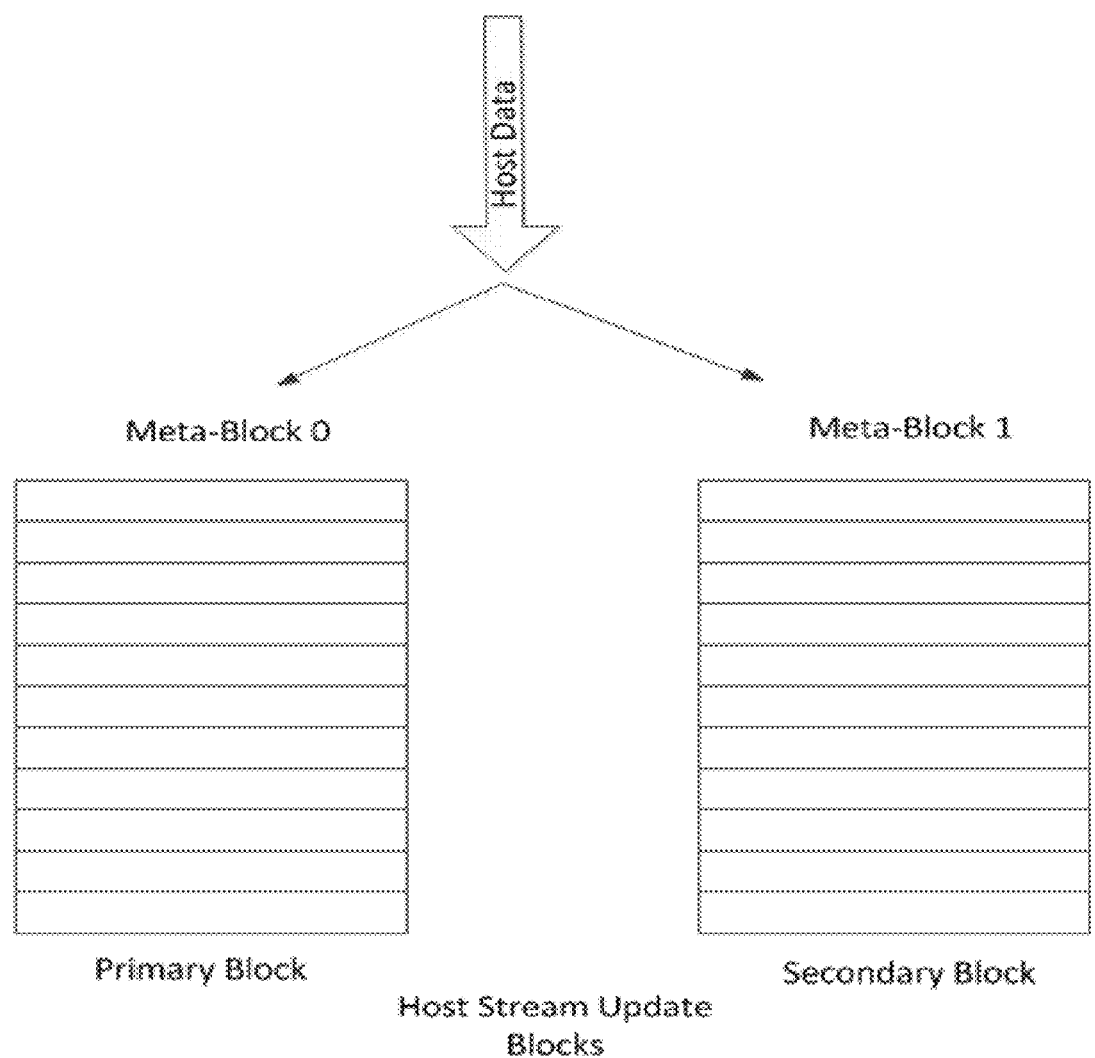
FIG. 8 is a diagram of an exemplary host stream to update blocks.

Referring back to FIG. 5, the meta-blocks that are to be used for dual programming update blocks may be identified in block 510. The host data is written to two update blocks, primary and secondary, simultaneously or substantially simultaneously. The identification may include the identification of meta-block 0 (i.e. "primary block") and a meta-block 1 ("secondary block"). The primary block is programmed in block 512 and the secondary block is programmed in block 514 as further illustrated in FIG. 8. FIG. 8 is a diagram of an exemplary host stream to update blocks. FIG. 8 illustrates that the host data that is received from the host is programmed to both the primary block and the secondary block. Having the data programmed twice can be a fail-safe for retrieving data when there has been a failure. For example, if there is a failure in the primary block, then the data is not lost because the secondary block may be used to retrieve the data as further discussed below with respect to blocks 516-520 in FIG. 5. This data protection scheme may be effective when a program failure or wordline-to-wordline (WL-WL) short does not occur simultaneously in both the primary and secondary update blocks. In other words, the simultaneous programming of the secondary update block may act as a backup copy of the programmed data if there is a problem or failure with the primary update block.

Figure 9:
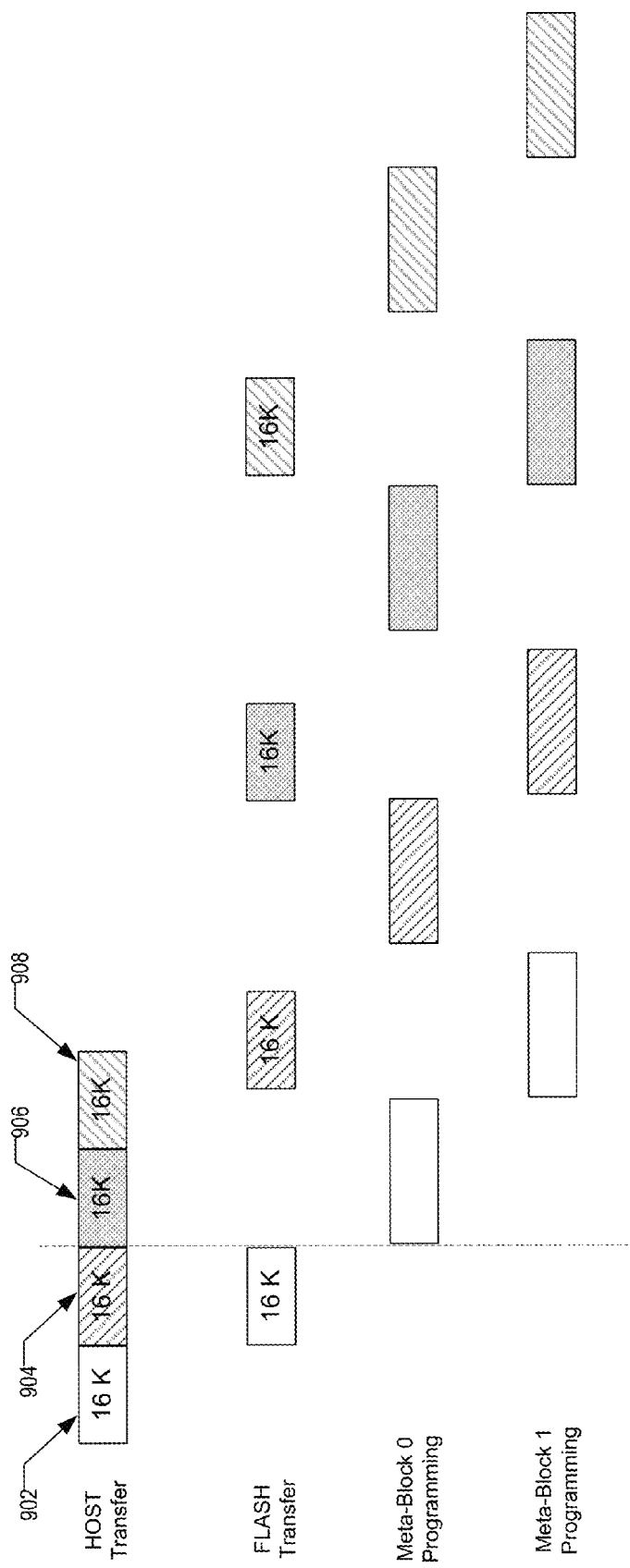
FIG. 9 is a transfer diagram for programming meta-blocks in a single die system.

FIG. 9 is a transfer diagram for programming meta-blocks in a single die system. In certain systems or embodiments, there may be dual programming of meta-blocks that are from the same die. However, FIG. 9 illustrates meta-block programming that is not dual or simultaneous as compared with the dual programming shown in FIG. 10. A host transfer of four 16 k blocks 902, 904, 906, 908 is received. The data is then transferred to the flash and may be transferred to the RAM of the flash. As shown in the flash transfer portion, the 16 k block 902 is subsequently transferred to RAM after the host transfer of the 16 k 902 occurs. Likewise, the RAM transfer to flash of the 16 k block 904 occurs after the host transfer of the 16 k block 904. Subsequent to those transfers, that data is then programmed to two meta-blocks (meta-block 0 and meta-block 1); however, FIG. 9 illustrates that the programming to the two different meta-blocks is not simultaneous as opposed to the simultaneous or dual programming illustrated in FIG. 10.

Figure 10:
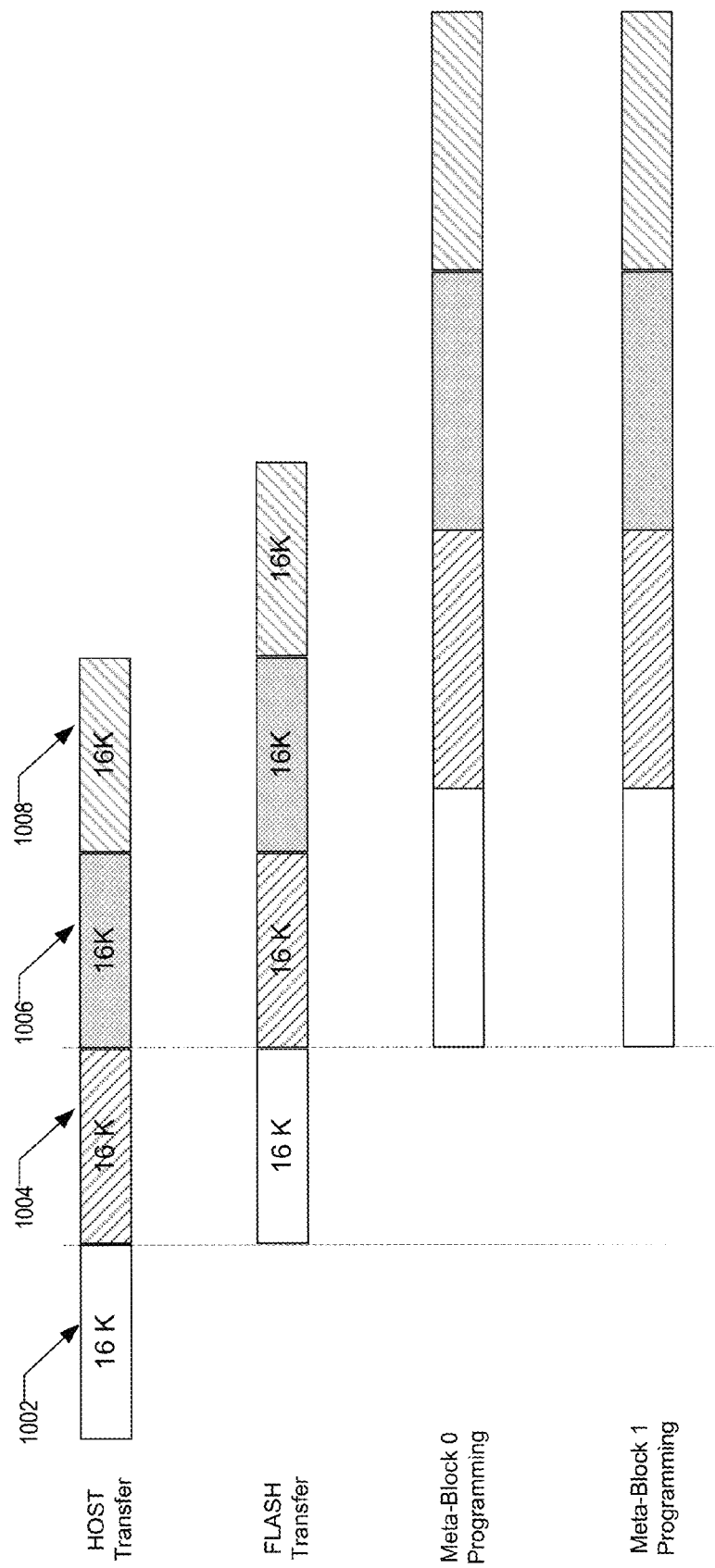
FIG. 10 is a transfer diagram for dual programming meta-blocks.

FIG. 10 is a transfer diagram for dual programming meta-blocks. FIG. 10 further illustrates the dual write concept of programming two meta-blocks simultaneously. A host transfer of four 16 k blocks 1002, 1004, 1006, 1008 is received. The data is then transferred to the flash and may be transferred to the RAM of the flash. As shown in the flash transfer portion, the 16 k block 1002 is subsequently transferred to RAM after the host transfer of the 16 k 1002 occurs. Likewise, the RAM transfer to flash of the 16 k block 1004 occurs after the host transfer of the 16 k block 1004. Subsequent to those transfers, that data is then programmed to two meta-blocks (meta-block 0 and meta-block 1) simultaneously as shown in FIG. 10. This simultaneous programming of meta-blocks illustrates the dual write nature of the data blocks 1002-1008.

Referring back to FIG. 5, when the dual programming 506 has occurred and the meta-blocks are programmed, there may be an error checking function that is performed before the data is committed to the memory from the update block. In block 516, errors in the primary block are checked, such as with enhanced post-write-read error management (EPWR). If there are no uncorrectable error codes (UECC) from EPWR in the primary block, then the data is committed from the primary block as in block 518.

Figure 11:
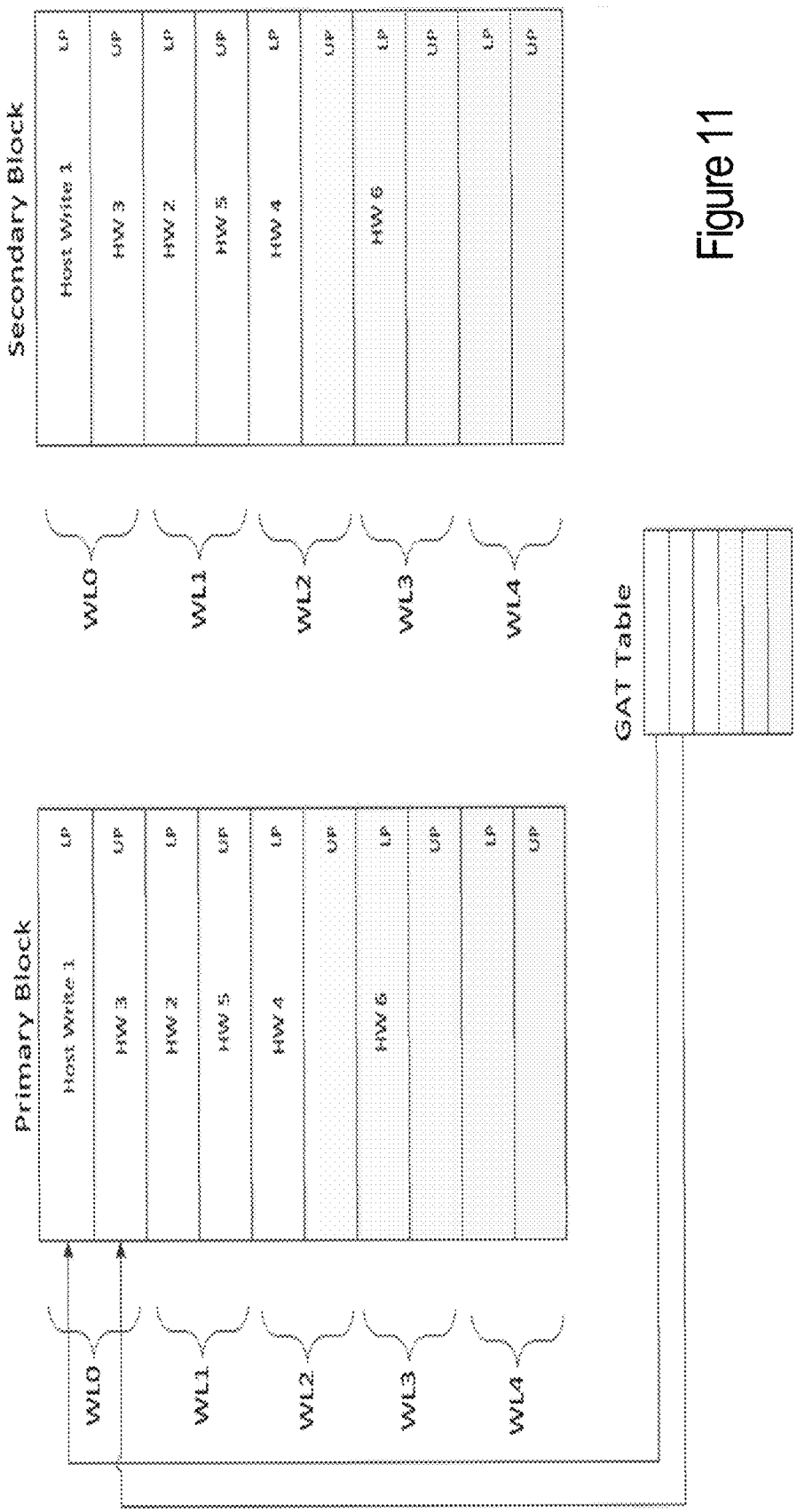
FIG. 11 is a diagram of exemplary data flow in a primary block.

FIG. 11 is a diagram of exemplary data flow in a primary block such that data is committed from the primary block as in block 518. In particular, FIG. 11 illustrates the different wordlines (WL) for both the primary block and the secondary block. Each wordline may include a lower page (LP) and an upper page (UP). The host write is written into the lower page of a wordline in the primary block and that same data is also written into the lower page of a wordline in the secondary block. The data in WL0 of the primary block is committed (and recorded in the index/GAT table in FIG. 11) when there are no uncorrectable error codes (UECC) errors found after performing enhanced post-write-read error management (EPWR). Conversely, the data in WL1 is not yet committed since it may still be vulnerable to WL-WL short failure while programming the upper page UP of WL2.

Figure 12:
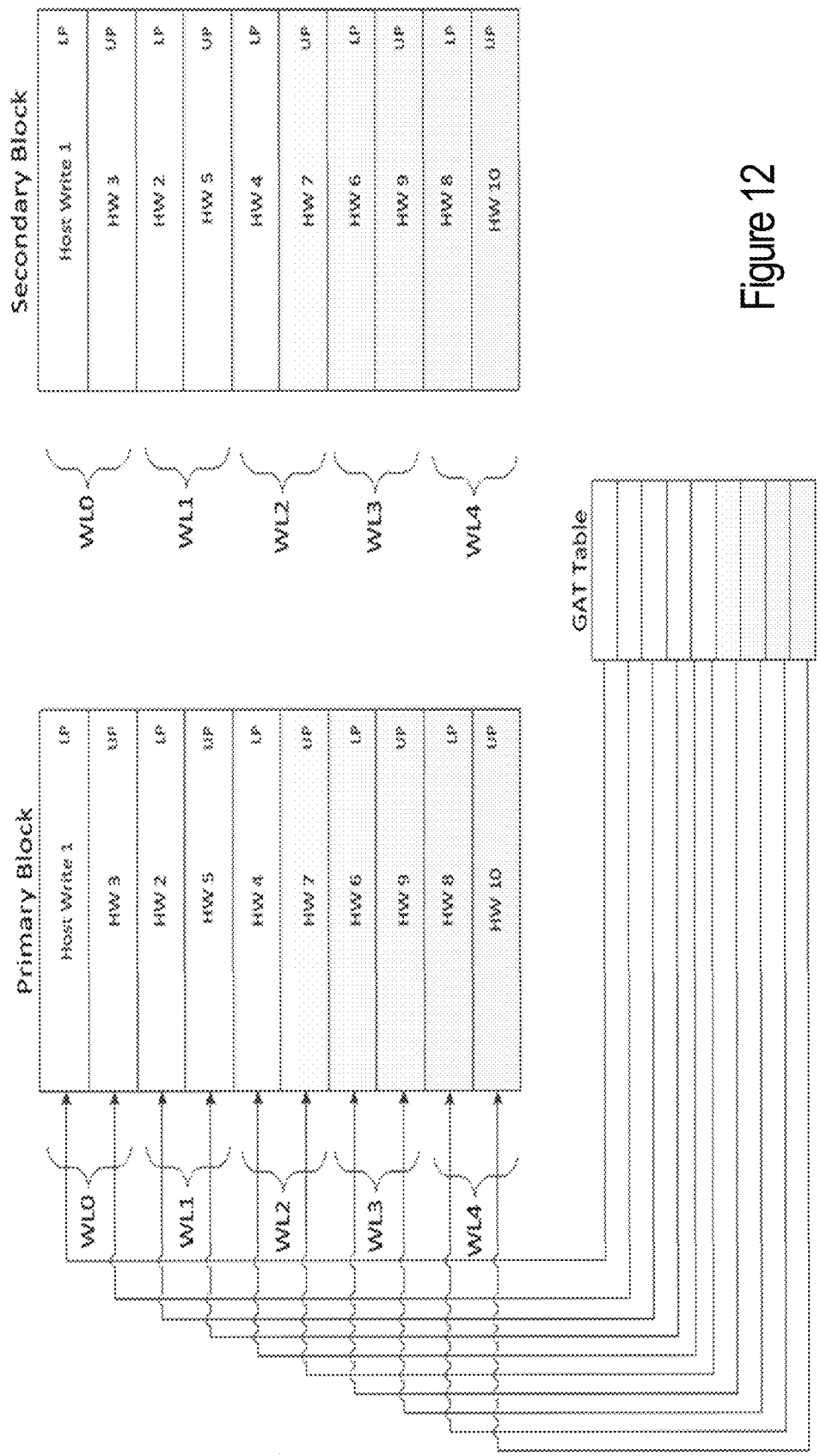
FIG. 12 is a diagram of exemplary data flow in a primary block with no failures.

FIG. 12 is a diagram of exemplary data flow in a primary block with no failures. After reaching the end of the primary update block, if there were no failures, all the host data may be indexed from primary block. FIG. 12 illustrates that the GAT/indexing table indexes all the wordlines from the primary block and none from the secondary block, which can be erased, cycled (as in FIG. 14) and used for future host writes.

Referring back to FIG. 5, if there is a UECC in the primary block, then the data may be committed from the secondary block in block 520. After programming a certain number of wordlines (WLs) in the primary block, EPWR may be performed before committing the data in those WLs. If there is a UECC during EPWR or program failure or WL-WL short while programming the primary block, the data in the affected logical pages may be indexed from the secondary block, rather than the primary block.

Figure 13:
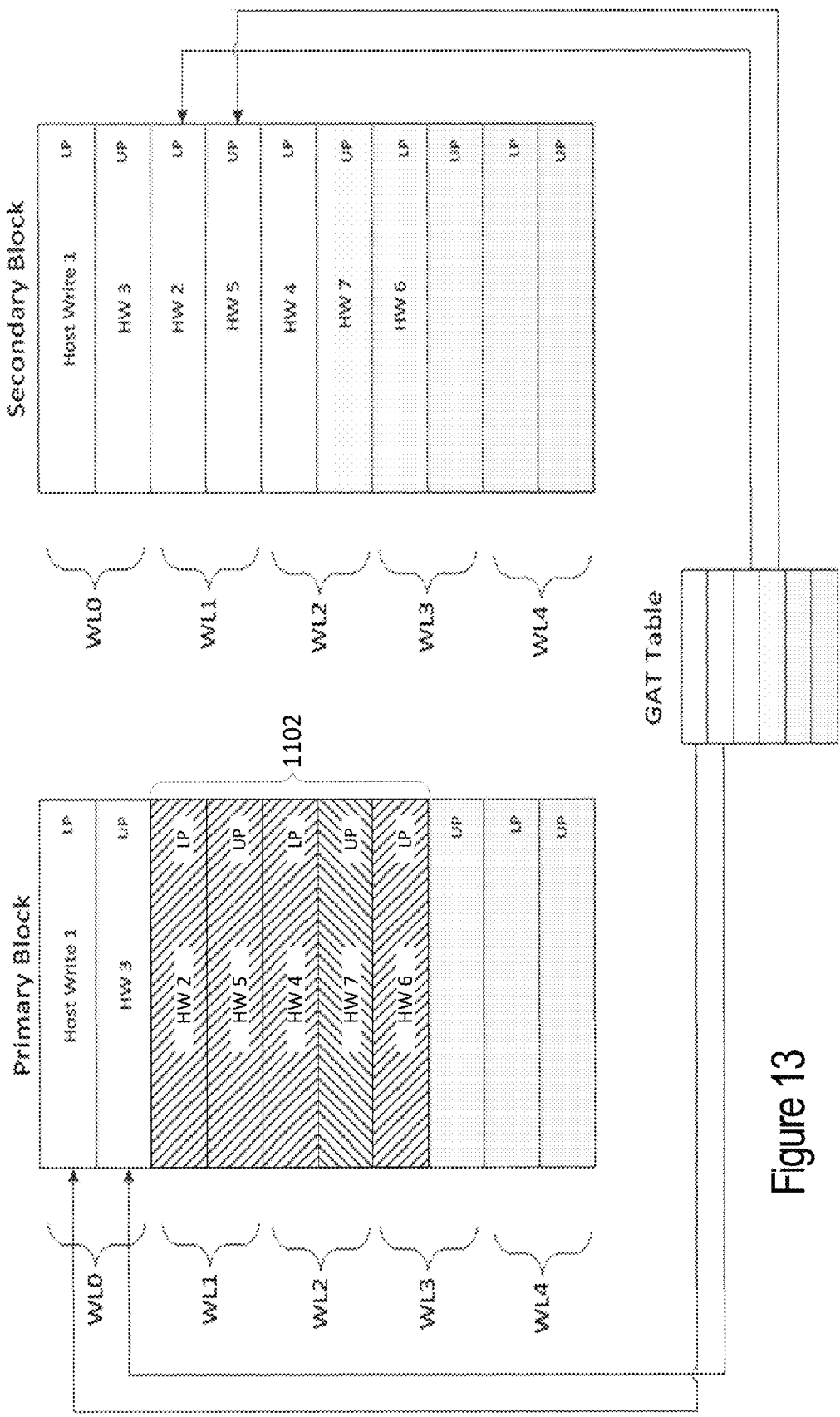
FIG. 13 is a diagram of exemplary data flow in a primary block with a failure.

FIG. 13 is a diagram of exemplary data flow in a primary block with a failure that also illustrates which neighboring wordlines may be affected by such a failure. While programming the upper page of WL2 (i.e. host write 7) of the primary block, if there is a WL-WL short failure, the data in WL1, WL2 and WL3 can be corrupted. In other words, neighboring wordlines may be corrupted by a failure of one wordline. In this instance, a failure in the upper page of WL2 may result in the corruption of both blocks in WL1 and WL3. Assuming that there is no such failure while programming the upper page of WL2 of secondary block, the data in WL1 can be committed after doing EPWR. Accordingly, the GAT/indexing table may index the data for WL1 and WL2 to the secondary block rather than the primary block. Since the data in WL3 has not been fully programmed (i.e. both LP and UP are programmed for that wordline), it may not be indexed yet.

Figure 14:
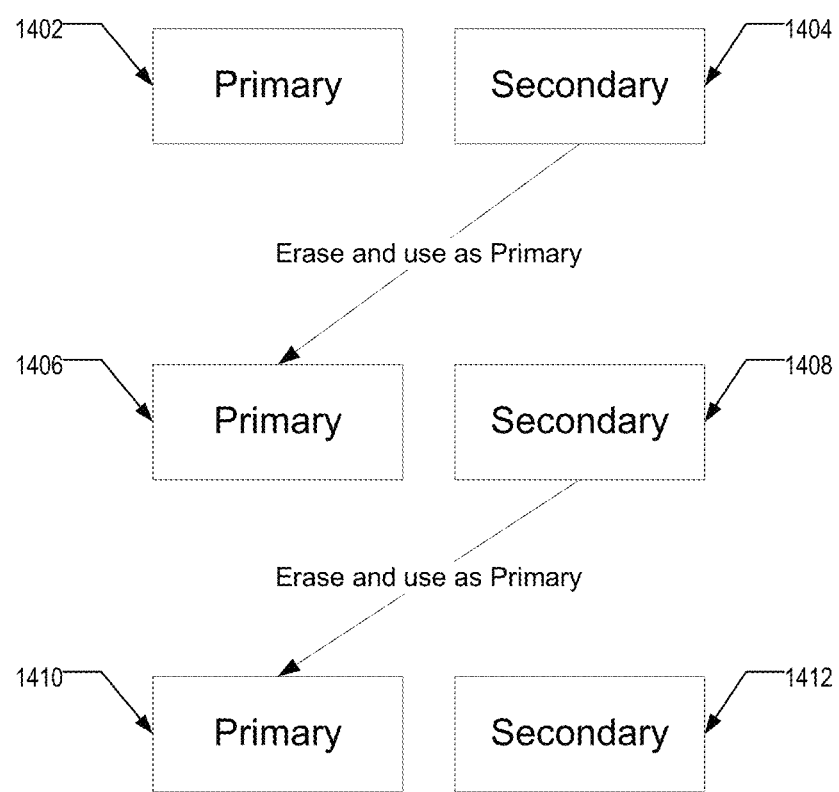
FIG. 14 is a diagram of exemplary block cycling.

Referring back to FIG. 5, once the data is committed the primary update block and the secondary update block are recycled as shown in FIG. 14. FIG. 14 is a diagram of exemplary update block cycling. When the primary block 1402 and secondary block 1404 are used initially and the data is committed from the primary block, then the secondary block 1404 may be erased and used as next primary block 1406. A new secondary block 1408 is used with that next primary block 1406. Assuming the data is committed from the next primary block 1406, then the new secondary block 1408 becomes the next primary block 1410 and another new secondary block 1412 is chosen.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A flash memory device comprising:
   a non-volatile storage having memory blocks on multiple die; and
   a controller in communication with the non-volatile storage, the controller is configured to:
      identify one or more of the memory blocks from a first die as a primary update meta-block;
      identify one or more of the memory blocks from a second die as a secondary update meta-block; and
      program, simultaneously, the primary update meta-block and the secondary update meta-block with data from a host write command.

2. The device of claim 1 wherein the controller is further configured to:
   receive the host write command from a host, wherein the host write command comprises the data to be programmed to the non-volatile storage; and
   transfer the data to random access memory before the programming to the primary update meta-block and the secondary update meta-block.

3. The device of claim 1 wherein the programming comprises transferring the data from the host write command to the primary update meta-block and the secondary update meta-block.

4. The device of claim 1 wherein the controller is further configured to:
   check for errors from the programming of the primary update meta-block;
   commit data based on the host write command from the primary update meta-block, wherein the data is committed from the primary update meta-block to the non-volatile storage when there are no errors or failures with the primary update meta-block; and
   commit data based on the host write command from the secondary update meta-block, wherein the data is committed from the secondary update meta-block to the non-volatile storage when there are errors or failures with the primary update meta-block.

5. The device of claim 4 wherein the controller is further configured to:
   cycle the primary update meta-block; and
   cycle the secondary update meta-block as the primary update meta-block for a subsequent host write command.

6. The device of claim 4 wherein the checking for errors comprises enhanced post-write-read error management (EPWR).

7. The device of claim 4 wherein the errors or failures comprises one or more uncorrectable error codes (UECC).

8. The device of claim 4 wherein the controller is further configured to:
   erase the second update meta-block when there are no errors or failures with the primary update meta-block.

9. The device of claim 1 wherein the programming comprises a dual write to the primary update meta-block and to the secondary update meta-block.

10. The device of claim 1 wherein the non-volatile storage comprises a three-dimensional (3D) memory configuration.

11. A method for data protection in a memory device with a controller and non-volatile memory, the method comprising the controller:
    receiving a request for host data for the non-volatile memory;
    identifying a primary update block and identifying a secondary update block, wherein the primary update block and the secondary update block comprise blocks of memory from different die of the non-volatile memory;
    programming the host data to the primary update block and programming the host data to the secondary update block simultaneously; and
    committing the host data from the primary update block to the non-volatile memory and erasing the secondary update block when there is not a failure with the primary update block.

12. The method of claim 11 wherein the method further comprises the controller:
    committing the host data from the secondary update block to the non-volatile memory when there is a failure with the primary update block.

13. The method of claim 12 wherein the failure is identified as an uncorrectable error codes (UECC) from enhanced post-write-read error management (EPWR).

14. The method of claim 12 wherein the method further comprises the controller:
    cycling the primary update block; and
    cycling the secondary update block as a next primary update block for a subsequent request for host data to be written.

15. The method of claim 11 wherein the method further comprises the controller:
    transferring the host data to be written to random access memory on the memory device before the programming to the update blocks.

16. The method of claim 11 wherein the memory device comprises non-volatile storage for the blocks of memory, further wherein the non-volatile storage comprises a three-dimensional (3D) memory configuration.

17. A flash memory device comprising:
    a non-volatile storage comprising at least two dies; and
    a controller in communication with the non-volatile storage, the controller is configured to:
       receive host data for the non-volatile storage;
       establish a primary update block and a secondary update block, wherein the primary update block and the secondary update block are on different die from the at least two dies;
       simultaneously program the host data to the primary update block and the secondary update block; and commit, to the non-volatile storage, the host data from one of the primary update block or the secondary update block.

18. The device of claim 17 wherein the host data is committed from the primary update block unless there is an error or failure with the primary update block.

19. The device of claim 18 wherein the host data is committed from the secondary update block when there is an error or failure with the primary update block.

20. The device of claim 17 wherein the committing comprises storing the host data in memory blocks of the non-volatile storage that are not the primary or secondary update blocks.

* * * * *